United States Patent [19]
Hashimoto et al.

[11] Patent Number: 5,289,312
[45] Date of Patent: Feb. 22, 1994

[54] CATADIOPTRIC REDUCTION PROJECTION OPTICAL SYSTEM

[75] Inventors: Sumio Hashimoto, Tokyo; Yutaka Ichihara, Yokohama, both of Japan

[73] Assignee: Nikon Corporation, Tokyo, Japan

[21] Appl. No.: 948,327

[22] Filed: Sep. 22, 1992

[30] Foreign Application Priority Data

Sep. 28, 1991 [JP] Japan ................... 3-276594

[51] Int. Cl.⁵ ................. G02B 17/08; G02B 27/28
[52] U.S. Cl. .................. 359/487; 359/495; 359/727; 359/732; 359/738
[58] Field of Search ................. 359/726–740, 359/487, 495, 488, 494, 497, 499

[56] References Cited

U.S. PATENT DOCUMENTS

| | | | |
|---|---|---|---|
| 3,698,808 | 10/1972 | Delmas | 355/45 |
| 4,676,607 | 6/1987 | Wakamiya | 359/739 |
| 4,747,678 | 5/1988 | Shafer et al. | 350/505 |
| 4,793,696 | 12/1988 | Suh | 369/44.23 |
| 4,953,960 | 9/1990 | Williamson | 350/442 |

*Primary Examiner*—Bruce Y. Arnold
*Assistant Examiner*—James Phan
*Attorney, Agent, or Firm*—Shapiro and Shapiro

[57] ABSTRACT

A catadioptric reduction projection optical system is of a construction in which an on-axis light beam is used in a catadioptric system, and is designed such that resolving power is not deteriorated and a stop can be disposed. The catadioptric reduction projection optical system has a first lens unit G1 having negative refractive power and diffusing a light beam from a reticle 1, a semi-transparent mirror 2 for transmitting therethrough or reflecting the light beam from the first lens unit G1, a second lens unit G2 having negative refractive power and widening the light beam reflected from the semi-transparent mirror 2, a concave reflecting mirror 4 for returning the light beam from the second lens unit G2 to the semi-transparent mirror 2 through the second lens unit G2 while converging that light beam, a third lens unit G3 having positive refractive power and converging the light beam returned to and transmitted through the semi-transmitted mirror 2 on a wafer 5, and a stop 6 disposed between the semi-transparent mirror 2 and the third lens unit G3.

13 Claims, 3 Drawing Sheets

CATADIOPTRIC REDUCTION PROJECTION OPTICAL SYSTEM

BACKGROUND OF THE INVENTION

1. Field of the Invention

This invention relates to a catadioptric reduction projection optical system suitable for application as an optical system for reduction-projecting a pattern more enlarged than the pattern of a real element which is used, for example, in an exposure apparatus for the manufacture of semiconductive elements.

2. Related Background Art

Semiconductive integrated circuits have become more and more minute and higher resolving power is required of exposure apparatuses for printing the patterns thereof. To satisfy this requirement, the wavelength of a light source must be shortened and the numerical aperture (N.A.) of an optical system must be made great. However, if the wavelength becomes short, glass materials which stand practical use for the absorption of light become limited. If the wavelength becomes 300 nm or less, practically usable glass materials will be only synthetic quartz and fluorite (calcium fluoride). Fluorite is bad in temperature characteristic and cannot be used in a great quantity. Therefore it is very difficult to make a projection lens of a refracting system alone. Further, due to the difficulty of aberration correction, it is also difficult to make a projection optical system of great numerical aperture of a reflecting system alone.

So, various techniques of combining a reflecting system and a refracting system to thereby construct a projection optical system have heretofore been proposed. An example of them is a ring field optical system as disclosed in U.S. Pat. No. 4,747,678 (corresponding to Japanese Laid-Open Patent Application No. 63-163319). In this optical system, an off-axis light beam is used so that incident light and reflected light may not interfere with each other, and the design is such that only the off-axis zonal portion is exposed.

As another example, a projection exposure apparatus comprising a catadioptric system in which a beam splitter is disposed in a projection optical system, whereby the image of a reticle (mask) is collectively projected by an on-axis light beam is disclosed, for example, in U.S. Pat. No. 3,698,808 (corresponding to Japanese Patent Publication No. 51-27116) and U.S. Pat. No. 4,953,960 (corresponding to Japanese Laid-Open Patent Application No. 2-66510).

FIG. 3 of the accompanying drawings schematically shows the optical system disclosed in U.S. Pat. No. 4,953,960. In FIG. 3, a light beam from a reticle 21 on which a pattern to be reduction-transferred is depicted is converted into a substantially parallel light beam by a lens unit 22 having positive refractive power and is applied to a prism type beam splitter (beam splitter cube) 23. The light beam transmitted through the joint surface 23a of the beam splitter 23 is diffused by a correcting lens unit 24 having negative refractive power and is reflected by a concave reflecting mirror 25. The light beam reflected by the concave reflecting mirror 25 passes again through the correcting lens unit 24 and is reflected by the joint surface 23a of the beam splitter 23, whereafter it is converged on a wafer 27 by a lens unit 26 having positive refractive power, and the reduced image of the reticle pattern is formed on the wafer 27. An example in which a semi-transparent mirror comprising a plane parallel plate is used instead of the prism type beam splitter is also disclosed in the aforementioned patent.

In the ring field optical system of the prior art, however, it is difficult to make the numerical aperture great. Moreover, exposure cannot be collectively effected and therefore, it is necessary to effect exposure while moving the reticle and the wafer at different speeds correspondingly to the reduction ratio of the optical system, and this has led to the inconvenience that the construction of a mechanical system becomes complicated.

Also, the construction disclosed in the aforementioned U.S. Pat. No. 3,698,808 suffers from the inconvenience that the flare by the reflection on the refracting surface of the optical system subsequent to the beam splitter is great. Further, no consideration is given to characteristics such as the reflectance irregularity, absorption and phase variation of the beam splitter and therefore, the resolving power is low and also, the magnification of the entire system is one-to-one magnification, and the apparatus of this patent cannot possibly stand the use as the exposure apparatus for the manufacture of semiconductors of the coming generation of which higher resolving power will be required.

Further, of the projection optical system disclosed in U.S. Pat. No. 4,953,960 the optical system of FIG. 4 thereof suffers from the inconvenience that the resolving power is deteriorated by the non-uniformity of the material of the bulky prism for the beam splitter 23. It also suffers from the inconvenience that there is no adhesive agent usable for the wavelength range of about 300 nm or less and it is difficult to construct a beam splitter by cementing two blocks together. Also, that projection optical system has suffered from the inconvenience that a stop is at a location overlapping with the beam splitter 23 or the semi-transparent mirror and the stop cannot be physically placed. Thus, the resolving power is deteriorated, the irregularity of the quantity of light cannot be corrected and further, the telecentricity of the wafer 7 side cannot be secured, and this apparatus has not been practical as a semiconductor exposure apparatus.

SUMMARY OF THE INVENTION

In view of the above-noted points, the present invention has as an object the provision of a reduction projection optical system of a construction in which an on-axis light beam is used in a catadioptric system and resolving power is not deteriorated and a stop can be disposed.

A catadioptric reduction projection optical system according to the present invention, as shown, for example, in FIG. 1 of the accompanying drawings, is an optical system for reduction-projecting the pattern of a first surface (1) onto a second surface (5), and has a first lens unit G1 having negative or positive refractive power and diffusing or converging a light beam from the first surface (1), a semi-transparent mirror (2) for transmitting therethrough or reflecting the light beam from the first lens unit G1, a second lens unit G2 having negative refractive power and widening the light beam reflected from the semi-transparent mirror (2), a concave reflecting mirror (4) for returning the light beam from the second lens unit G2 to the semi-transparent mirror (2) through the second lens unit G2 while converging said light beam, a third lens unit G3 having positive refractive power and converging the light beam returned to the semi-transparent mirror (2) and transmitted through the semi-transparent mirror (2) and forming the reduced image of the pattern of the first surface (1) on the second surface (5), and a stop (6) disposed between the semi-transparent mirror (2) and the third lens unit G3.

Further, it is also conceivable to dispose one or more plane parallel plates for correcting aberrations attributable to the semi-transparent mirror (2) obliquely with respect to the optical axis between the semi-transparent mirror (2) and the third lens unit G3.

In these cases, it is preferable that the radius of curvature of the concave reflecting mirror (4) be set within a range of 17 times to 25 times the diameter of the exposure area (image circle) on the second surface (5).

Also, it is preferable that the inclination of the marginal ray from the on-axis object point transmitted through the semi-transparent mirror (2) with respect to the optical axis be 0.1° or less.

Further, it is preferable that the inclination of the off-axis principal ray incident on the concave reflecting mirror (4) with respect to the optical axis be 4° or less.

Also, in the present invention, it is preferable that a quarter wavelength plate (3) be disposed between the semi-transparent mirror (2) and the concave reflecting mirror (4).

The quarter wavelength plate (3) may preferably be formed of uniaxial crystal (e.g. rock crystal) having a thickness of 100 μm or less.

According to such present invention, in a construction wherein a reflecting system and a refracting system are combined, an on-axis light beam is used to expose a wide area collectively. Also, the reflecting system has no chromatic aberration and therefore, the concave reflecting mirror (4) is endowed with most of the refractive power of the entire system to suppress the creation of chromatic aberration. The separation of incident light and reflected light is effected by the semi-transparent mirror. The semi-transparent mirror (2) is used because a large glass material as compared with a prism type beam splitter is unnecessary, because the semi-transparent mirror is a single piece and does not require any adhesive agent and because the surface accuracy may be bad correspondingly to the refractive index.

However, the use of the semi-transparent mirror (2) creates astigmatism and coma. To prevent this, it is necessary that the light beam transmitted through the semi-transparent mirror (2) be made into a completely parallel light beam. However, it is impossible to realize a completely parallel light beam for all image heights. So, in the present invention, the light beam diffused or converged by the first lens unit G1 is reflected by the semi-transparent mirror (2) to thereby eliminate the influence of the semi-transparent mirror (2). The converted light reflected from the concave reflecting mirror (4) is made approximate to a parallel light beam by the second lens unit G2 of negative refractive power so that this light made approximate to a parallel light beam may be transmitted through the semi-transparent mirror (2). Accordingly, the creation of astigmatism and coma on the semi-transparent mirror (2) is suppressed.

Also, the light beam transmitted through the semi-transparent mirror (2) is a substantially parallel light beam, but generally, an aperture stop is placed at a location whereat the light emerging from the object point becomes a substantially parallel light beam. Thus, according to the construction of the present invention, an effective stop (6) can be disposed between the semi-transparent mirror (2) and the third lens unit G3.

Further, in the present invention, the second lens unit G2 having negative refractive power is disposed between the semi-transparent mirror (2) and the concave reflecting mirror (4), and by this second lens unit G2, the chromatic aberration of the third lens unit G3 of positive refractive power can be corrected and the spherical aberration of the concave reflecting mirror (4) can be corrected well. Also, as described above, this second lens unit G2 of negative refractive power has the important role of making the light beam transmitted through the semi-transparent mirror (2) approximate to a parallel light beam.

Next, to more effectively suppress astigmatism and coma attributable to the semi-transparent mirror (2), it is preferable that the light beam be made as approximate as possible to a parallel light beam to thereby make coma sufficiently small and moreover a plane parallel plate be inserted obliquely with respect to the optical axis between the semi-transparent mirror (2) and the third lens unit G3. Particularly, a plane parallel plate equal in thickness to the semi-transparent mirror (2) is inclined by 45° with respect to the optical axis and the azimuth of the plane parallel plate is rotated by 90° relative to the azimuth of the semi-transparent mirror (2), whereby astigmatism is also corrected. Further, if use is made of three plane parallel plates each of which is equal in thickness to the semi-transparent mirror (2), astigmatism and coma can be corrected even when the light beam transmitted through the semi-transparent mirror (2) is not a substantially parallel light beam. That is, by the three plane parallel plates being inclined by 45° with respect to the optical axis and being set so as to form angles of 90°, 180° and 270°, respectively, with respect to the azimuth of the semi-transparent mirror (2), astigmatism and coma are corrected completely.

A description will now be given of the reason why it is preferable that the radius of curvature of the concave reflecting mirror (4) be 17 times to 25 times as great as the diameter of the exposure area (image circle) on the second surface (5). In the concave reflecting mirror, a certain degree of reduction magnification can be achieved by the converging action thereof and also, Petzval sum, astigmatism and distortion are affected thereby and therefore, it becomes possible to maintain the aberration balance with the refracting system comprising the first lens unit G1, the second lens unit G2 and the third lens unit G3 good. That is, if the radius of curvature of the concave reflecting mirror (4) is below 17 times the diameter of the image circle of the second surface (5), it will be advantageous for the correction of chromatic aberration, but Petzval sum will increase in the positive direction and astigmatism and distortion will also increase.

The reason is that if the radius of curvature of the concave reflecting mirror becomes small and refractive power becomes great, the spherical aberration by the concave reflecting mirror (4) will become great, but for the correction of the spherical aberration, it becomes necessary to make the positive refractive power of the third lens unit G3 great, because to make the light beam transmitted through the semi-transparent mirror (2) into a parallel light beam, the refractive power of the second lens unit G2 becomes great. However, the third lens unit G3 is disposed at a location near the second surface (5) as the image plane and therefore, for the correction of aberrations, refractive power greater than the negative refractive power of the second lens unit G2 becomes necessary and thus, Petzval sum increases remarkably. Accordingly, to correct aberrations better, it is desirable that the radius of curvature of the concave reflecting mirror (4) be about 19 or more times as great as the diameter of the image circle of the reduced image.

If conversely, the radius of curvature of the concave reflecting mirror (4) becomes great beyond 25 times the diameter of the image circle of the reduced image, it will be advantageous for the correction of astigmatism and distortion, but it will become difficult to obtain a desired reduction magnification and the correction of chromatic aberration will become insufficient, and this is not very practical.

A description will now be given of the reason why it is preferable that the inclination of the marginal ray (so-called Rand ray) from the on-axis object point transmitted through the semi-transparent mirror (2) with respect to the optical axis be 0.1° or less. As described above, the more approximate to a parallel light beam is the light beam transmitted through the semi-transparent mirror (2), the more suppressed is the creation of aberrations attributable to the semi-transparent mirror (2) and the easier it becomes to dispose the stop. Particularly, when the maximum value of the deviation of said light beam from the parallel light beam is 0.1° or less, the amount of aberration is small, and this is practical.

A description will also be given of the reason why it is preferable that the inclination of the off-axis principal ray incident on the concave reflecting mirror (4) with respect to the optical axis be 4° or less. If the inclination of the off-axis principal ray is not so limited, the astigmatism, etc. of the concave reflecting mirror (4) will become too great. So, by limiting the inclination of the off-axis principal ray with respect to the optical axis to 4° or less, the creation of aberrations attributable to the concave reflecting mirror (4) is suppressed and the imaging performance is improved as a whole.

A description will also be given of the operational effect in a case where a quarter wavelength plate (3) is disposed between the semi-transparent mirror (2) and the concave reflecting mirror (4). Generally, dielectric material film used as the semi-transparent surface of a semi-transparent mirror has a strong polarizing characteristic, and for example, a light beam polarized perpendicularly to the plane of the drawing sheet of FIG. 1 (s-polarized light) is readily reflected by the semi-transparent surface 2a of the semi-transparent mirror (2) and a light beam polarized in parallelism to the plane of the drawing sheet of FIG. 1 (p-polarized light) is readily transmitted through the semi-transparent surface 2a of the semi-transparent mirror (2). In this case, the s-polarized light component reflected by the semi-transparent surface 2a is transmitted through the quarter wavelength plate (3) and becomes circularly polarized light, and this circularly polarized light beam is reflected by the concave reflecting mirror (4) and becomes circularly polarized light opposite in direction. The reflected circularly polarized light opposite in direction is transmitted through the quarter wavelength plate (3), whereby it becomes p-polarized light, and most of this p-polarized light beam is transmitted through the semi-transparent surface 2a of the semi-transparent mirror (2) and travels toward the second surface (5). Accordingly, not only the loss of the quantity of light in the semi-transparent mirror (2) can be decreased by the quarter wavelength plate (3), but also it becomes difficult for any excess reflected light to return to the second surface (5) and thus, flare can be decreased.

Further, it is desirable that thin uniaxial crystal (e.g. rock crystal) be used as the quarter wavelength plate (3). The reason is that if the light beam transmitted through the quarter wavelength plate deviates from a parallel light beam, astigmatism will be created to abnormal rays. This astigmatism cannot be corrected by a method of rotating two sheets of crystal by 90° about the optical axis with respect to each other and cementing them together as is done with ordinary wavelength plates. That is, astigmatism will be created to both of normal rays and abnormal rays.

Assuming that the amount of this astigmatism is represented by a wave surface aberration W and when $(n_o - n_e)$ is the difference in refractive index between normal rays and abnormal rays and d is the thickness of the crystal and $\theta$ is the deviation from the parallel light, i.e., the angle of divergence (or convergence) of the light beam, the wave surface aberration W is represented by the following equation:

$$W = (n_o - n_e) d \theta^2 / 2$$

Where for example, the quarter wavelength plate is constructed of rock crystal, $(n_o - n_e) = 0.01$ and the state of divergence (convergence) of the light beam is $\theta = 14°$. When the wavelength used is $\lambda$, to maintain a sufficiently good imaging performance, it is preferable that the wave surface aberration W be maintained at a quarter wavelength, i.e., $\lambda/4$, or less. For that purpose, on the assumption that the wavelength $\lambda$ is e.g. 248 nm, from the above equation, d must be $$d < 100 \ \mu m.$$

DETAILED DESCRIPTION OF THE PREFERRED EMBODIMENTS

An embodiment of a catadioptric reduction projection optical system according to the present invention will hereinafter be described with reference to FIGS. 1 and 2. This embodiment is one in which the present invention is applied to the optical system of an exposure apparatus for the manufacture of semiconductors in which the wavelength used is 248 nm and the reduction magnification is 1/5.

Figure 1:
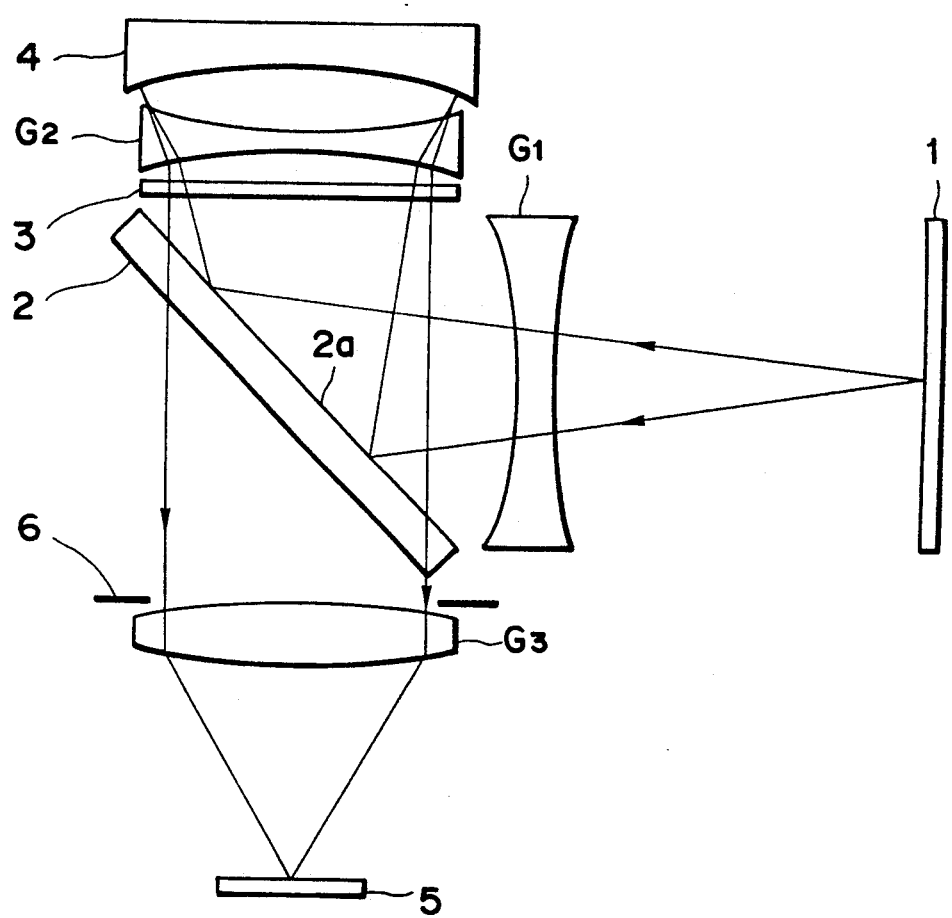
FIG. 1 is a cross-sectional view showing the basic construction of an embodiment of a catadioptric reduction projection optical system according to the present invention.

Referring to FIG. 1 which schematically shows the construction of the optical system of the present embodiment, the reference numeral 1 designates a reticle on which a pattern for integrated circuit is formed. On an optical axis perpendicular to this reticle 1, there are disposed in succession a first lens unit G1 having negative or positive refractive power and a semi-transparent mirror 2 inclined by 45° with respect to the optical axis. In a direction in which light from the first lens unit G1 is reflected by the semi-transparent surface 2a of the semi-transparent mirror 2, there are disposed in succession a quarter wavelength plate 3, a second lens unit G2 having negative refractive power and a concave reflecting mirror 4, and in a direction in which the reflected light by the concave reflecting mirror 4 is transmitted through the semi-transparent surface 2a of the semi-transparent mirror 2, there are disposed in succession a stop 6, a third lens unit G3 having positive refractive power and a wafer 5. The stop 6 may also be placed, for example, before the third lens unit G3.

In this case, if the light beam transmitted through the semi-transparent mirror 2 deviates even slightly from a parallel light beam, aberrations such as astigmatism, etc. will be created. So, when the requirement to aberrations is severe, the light beam transmitted through the semi-transparent mirror 2 is first made approximate to a parallel light beam to thereby make coma sufficiently small. A plane parallel plate equal in thickness to the semi-transparent mirror 2 is disposed at 45° with respect to the optical axis between the semi-transparent mirror 2 and the third lens G3, and the azimuth thereof is rotated by 90° with respect to the azimuth of the semi-transparent mirror 2. Thereby astigmatism is corrected. Where three plane parallel plates are used, even if the light beam transmitted through the semi-transparent mirror 2 deviates from a parallel light beam, astigmatism and coma can be corrected.

The reticle 1 is illuminated by an illuminating optical system, not shown, and a light beam emerging from the reticle 1 is diffused or converged by the first lens unit G1 and is caused to enter the semi-transparent mirror 2. The light beam reflected by the semi-transparent surface 2a of the semi-transparent mirror 2 is caused to enter the concave reflecting mirror 4 through the quarter wavelength plate 3 and the second lens unit G2 of negative refractive power. The radius of curvature of the concave reflecting mirror 4 is about 400 mm. The light beam reflected by the concave reflecting mirror 4 passes through the second lens unit G2 and the quarter wavelength plate 3 and again enters the semi-transparent mirror 2 while being converged, and the light beam transmitted through the semi-transparent surface 2a of the semi-transparent mirror 2 is converged on the wafer 5 by the third lens unit G3 of positive refractive power. Thereby the reduced image of the pattern on the reticle 1 is formed on the wafer 5.

Although in the present embodiment, the stop 6 is disposed between the semi-transparent mirror 2 and the third lens unit G3, the telecentricity of the wafer 5 side is secured by this stop 6.

Also, it is efficient that a light beam polarized perpendicularly to the plane of the drawing sheet of FIG. 1 (s-polarized light) be used as the illuminating light, but ordinary random-polarized illuminating light may also be used. In any case, most of the s-polarized light is reflected by the semi-transparent surface 2a due to the polarizing characteristic of the semi-transparent mirror 2, and this reflected light is transmitted through the quarter wavelength plate 3, whereby it becomes circularly polarized light. This circularly polarized light beam is reflected by the concave reflecting mirror 4 and becomes circularly polarized light opposite in direction, and when the circularly polarized light beam opposite in direction is again transmitted through the quarter wavelength plate 3, the polarized state becomes linear polarization parallel to the plane of the drawing sheet of FIG. 1. Most of the light beam polarized in a direction parallel to the plane of the drawing sheet of FIG. 1 by the polarizing characteristic of the semi-transparent mirror 2 is transmitted through the semi-transparent surface 2a and travels toward the wafer 5. Thereby the decrease in the light on the semi-transparent mirror 2 is prevented and the return light to the reticle 1 decreases and therefore, the effective utilization of the light beam and a decrease in flare can be achieved.

Further, by thin uniaxial crystal (e.g. rock crystal) being used as the quarter wavelength plate 3, the creation of astigmatism is prevented. Specifically, assuming that rock crystal is used, when the wavelength λ used is 248 nm, to suppress the wave surface aberration by the quarter wavelength plate 3 to λ/4 or below, it is necessary that the thickness of the quarter wavelength plate 3 be 100 μm or less.

If the semi-transparent surface 2a of the semi-transparent mirror 2 is positively endowed with a polarizing characteristic like that of a polarizing beam splitter, reflectance and transmittance can be further improved by the combination thereof with the quarter wavelength plate 3. However, even in case of an ordinary semi-transparent mirror, for example, the dielectric material film thereof has a strong polarizing characteristic and therefore, by the combination thereof with the quarter wavelength plate 3, reflectance and transmittance can be improved.

A specific example of the construction of the optical system of FIG. 1 will hereinafter be described.

In order to represent the shapes of and the spacings between lenses in the following embodiment, with the reticle 1 as the first surface, the surfaces through which the light emerging from the reticle 1 passes until it arrives at the wafer 5 are successively defined as the ith surface (i=2, 3, ... ).

As regards the sign of the radius of curvature $r_i$ of the ith surface, between the reticle 1 and the semi-transparent mirror 2, a case where the ith surface is convex relative to the reticle 1 is chosen to positive, and between the concave reflecting mirror 4 and the wafer 5, a case where the ith surface is convex relative to that concave reflecting mirror 4 is chosen to positive. Also, as regards the sign of the surface spacing $d_i$ between the ith surface and the (i+1)th surface, it is chosen to negative in the area wherein the reflected light from the semi-transparent surface 2a of the semi-transparent mirror 2 passes to the concave reflecting mirror 4, and it is chosen to positive in the other area. Also, as glass materials, $CaF_2$ represents fluorite and $SiO_2$ represents quartz glass. The refractive indices of quartz glass and fluorite for the standard wavelength used (248 nm) are as follows:

quartz glass: 1.50855
fluorite: 1.46799

Figure 2:
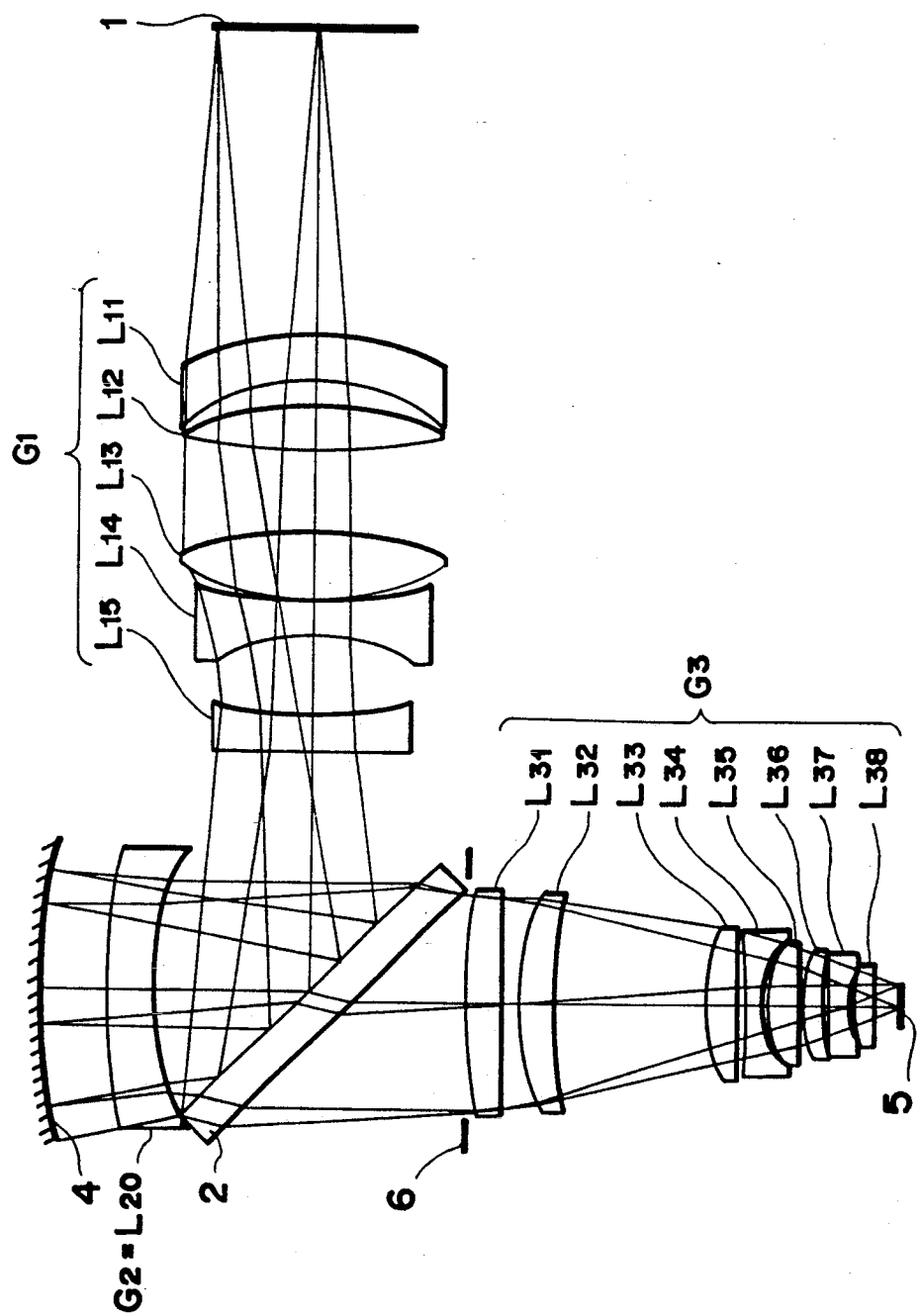
FIG. 2 is a lens construction view showing the specific construction of the optical system of FIG. 1.
Figure 3:
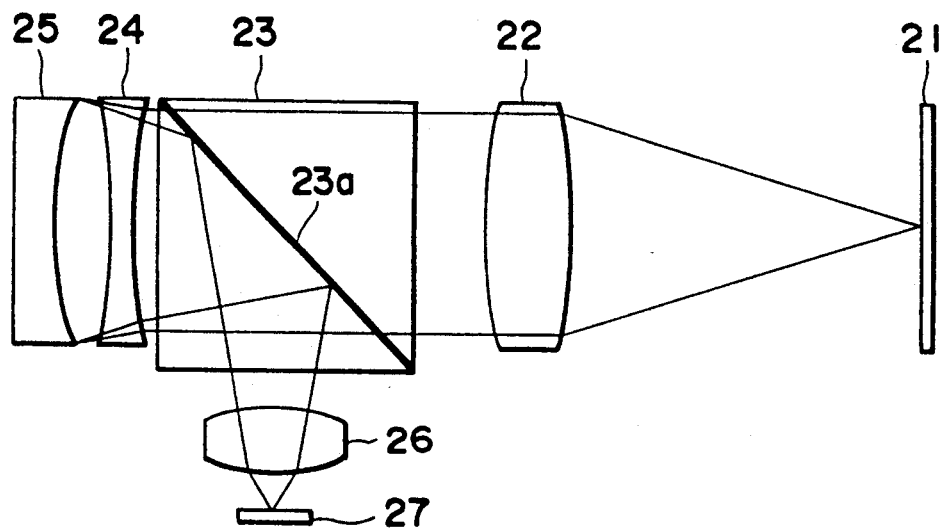
FIG. 3 is a cross-sectional view showing the basic construction of a catadioptric reduction projection optical system according to the prior art.

FIG. 2 shows the lens construction of the present embodiment. As shown in FIG. 2, the first lens unit G1 comprises, in succession from the reticle 1 side, a negative meniscus lens $L_{11}$ having its convex surface facing the reticle 1 side, a biconvex lens $L_{12}$, a biconvex lens $L_{13}$, a biconcave lens $L_{14}$ and a biconcave lens $L_{15}$. In the present embodiment, the second lens unit G2 is comprised of only a negative meniscus lens $L_{20}$ having its convex surface facing the concave reflecting mirror 4 side. Further, the third lens unit G3 comprises, in succession from the semi-transparent mirror 2 side, a biconvex lens $L_{31}$, a positive meniscus lens $L_{32}$ having its convex surface facing the semi-transparent mirror 2 side, a positive meniscus lens $L_{33}$ having its convex surface facing the semi-transparent mirror 2 side, a biconcave lens $L_{34}$, a biconvex lens $L_{35}$, a positive meniscus lens $L_{36}$ having its convex surface facing the semi-transparent mirror 2 side, a negative meniscus lens $L_{37}$ having its convex surface facing the semi-transparent mirror 2 side, and a positive meniscus lens $L_{38}$ having its convex surface facing the semi-transparent mirror 2 side. The quarter wavelength plate 3 in FIG. 1 is negligibly thin and therefore is not shown in FIG. 2.

The radius of curvature $r_i$, the surface spacing $d_i$ and glass materials in the embodiment of FIG. 2 are shown in Table 1 below.

[TABLE 1]

| i | $r_i$ | $d_i$ | glass material | i | $r_i$ | $d_i$ | glass material |
|---|---|---|---|---|---|---|---|
| 1 | ∞ | 160.328 | | 21 | −3775.726 | 8.500 | |
| 2 | 226.290 | 20.000 | CaF$_2$ | 22 | 132.037 | 20.000 | CaF$_2$ |
| 3 | 112.740 | 12.000 | | 23 | 386.661 | 80.662 | |
| 4 | 186.919 | 28.000 | SiO$_2$ | 24 | 90.751 | 16.727 | CaF$_2$ |
| 5 | −267.368 | 48.845 | | 25 | 1020.086 | 4.600 | |
| 6 | 203.766 | 30.000 | SiO$_2$ | 26 | −378.373 | 11.000 | SiO$_2$ |
| 7 | −153.468 | 2.000 | | 27 | 51.955 | 0.400 | |
| 8 | −235.200 | 15.000 | CaF$_2$ | 28 | 51.881 | 19.000 | CaF$_2$ |
| 9 | 105.304 | 45.805 | | 29 | −402.490 | 0.200 | |
| 10 | −154.442 | 18.000 | CaF$_2$ | 30 | 66.487 | 11.242 | CaF$_2$ |
| 11 | 661.852 | 128.795 | | 31 | 383.884 | 1.000 | |
| 12 | ∞ | −85.500 | | 32 | 580.000 | 10.000 | SiO$_2$ |
| 13 | 156.613 | −24.000 | SiO$_2$ | 33 | 39.378 | 1.600 | |
| 14 | 303.843 | −34.000 | | 34 | 43.274 | 13.000 | CaF$_2$ |
| 15 | 425.644 | 34.000 | | 35 | 514.049 | 14.381 | |
| 16 | 303.843 | 24.000 | SiO$_2$ | | | | |
| 17 | 156.613 | 85.500 | | | | | |
| 18 | ∞ | 20.000 | SiO$_2$ | | | | |
| 19 | ∞ | 60.000 | | | | | |
| 20 | 296.017 | 20.000 | CaF$_2$ | | | | |

In this embodiment, the reduction magnification is 1/5, the numerical aperture is 0.45 and the diameter d of the effective exposure area (image circle) on the wafer 5 is 20 mm. Also, the radius of curvature r of the concave reflecting mirror 4 is 425.664 mm, and the radius of curvature r is about 21.3 times the diameter d.

Further, the maximum value of the inclination of the marginal ray (Rand ray) from the on-axis object point incident on the concave reflecting mirror 4 with respect to the optical axis is 7.85°, and the maximum value of the inclination of the off-axis principal ray incident on the concave reflecting mirror 4 with respect to the optical axis is 2.41°. Incidentally, the maximum value of the inclination of the Rand ray emerging from the concave reflecting mirror 4 with respect to the optical axis is 0.014°. Further, the inclination of the Rand ray transmitted through the semi-transparent mirror 2 with respect to the optical axis is 0.01° or less, and in the present embodiment, the light beam transmitted through the semi-transparent mirror 2 can be regarded as a substantially parallel light beam.

In the embodiment of FIG. 2, in spite of the numerical aperture being as great as 0.45, various aberrations are corrected well in the wide area of the image circle. Chromatic aberration is also corrected well for the wavelength λ of 248 nm–249 nm.

The present invention is not restricted to the above-described embodiment, but of course can assume various constructions without departing from the gist of the invention.

What is claimed is:

1. A catadioptric reduction projection optical system for projecting a reduced image of a pattern of a first surface onto a second surface, including:

a first lens unit G1 for refracting a light beam from said first surface;

a semi-transparent mirror having a plane parallel plate for reflecting the light beam from said first lens unit G1;

a concave reflecting mirror for returning the light beam from said semi-transparent mirror to said semi-transparent mirror while converging said light beam;

a second lens unit G2 of negative refractive power disposed between said semi-transparent mirror and said concave reflecting mirror;

a third lens unit G3 of positive refractive power for converging the light beam returned to said semi-transparent mirror by the reflection on said concave reflecting mirror and transmitted through said semi-transparent mirror and forming the reduced image of the pattern of said first surface on said second surface; and stop means disposed between said semi-transparent mirror and said third lens unit G3.

2. A catadioptric reduction projection optical system according to claim 1, wherein the radius of curvature of said concave reflecting mirror is 17 times to 25 times the diameter of the exposure area on said second surface.

3. A catadioptric reduction projection optical system according to claim 1, wherein said first lens unit G1 has negative refractive power.

4. A catadioptric reduction projection optical system according to claim 1, wherein the inclination of the marginal ray from the on-axis object point transmitted through said semi-transparent mirror with respect to the optical axis is 0.1° or less.

5. A catadioptric reduction projection optical system according to claim 1, wherein the inclination of the off-axis principal ray incident on said concave reflecting mirror with respect to the optical axis is 4° or less.

6. A catadioptric reduction projection optical system according to claim 1, wherein said semi-transparent mirror further has a polarization separating surface for selectively reflecting or transmitting therethrough light in conformity with the direction of polarization, and a quarter wavelength plate is disposed between said semi-transparent mirror and said concave reflecting mirror.

7. A catadioptric reduction projection optical system according to claim 6, wherein the thickness of said quarter wavelength plate is 100 μm or less.

8. A catadioptric reduction projection optical system for projecting a reduced image of a pattern of a first surface onto a second surface, including:
- a semi-transparent mirror having a plane parallel plate for dividing the optical path of a light beam from said first surface into a reflecting optical path and a transmitting optical path;
- a concave reflecting mirror disposed on the reflecting optical path of an object light beam by said semi-transparent mirror for returning the light beam from said object to said semi-transparent mirror;
- an anterior lens unit disposed between said semi-transparent mirror and said first surface;
- an intermediate lens unit of negative refractive power disposed between said semi-transparent mirror and said concave reflecting mirror;
- a posterior lens unit of positive refractive power for converging the light beam returned to said semi-transparent mirror by said concave reflecting mirror and transmitted through said semi-transparent mirror and forming the reduced image of the pattern of said first surface on said second surface; and
- stop means disposed between said semi-transparent mirror and said posterior lens unit.

9. A catadioptric reduction projection optical system according to claim 8, wherein said intermediate lens unit of negative refractive power converts the light beam reflected from said concave reflecting mirror into a substantially parallel light beam.

10. A catadioptric reduction projection optical system according to claim 8, wherein said anterior lens unit has negative refractive power.

11. A catadioptric reduction projection optical system for reduction projecting a pattern of a first surface onto a second surface, including:
- a beam splitter for splitting an optical path of a light beam from the first surface into a reflection optical path and a transmission optical path;
- a concave reflecting mirror disposed in said reflection optical path of the light beam from the first surface for returning the light beam from the first surface to said beam splitter;
- an anterior lens unit disposed between said beam splitter and said first surface;
- an intermediate lens unit disposed between said beam splitter and said concave reflecting mirror;
- a posterior lens unit of positive refractive power for converging a light beam having been returned to said beam splitter by said concave reflecting mirror and transmitted by the beam splitter so as to form a reduced image of said pattern of said first surface on said second surface; and
- a stop means disposed in a light path of the light beam transmitted by said beam splitter and between said beam splitter and said posterior lens unit.

12. A catadioptric reduction projection optical system according to claim 11, wherein said intermediate lens unit has negative refractive power so as to change the light beam reflected by said concave mirror into a substantially parallel beam.

13. A catadioptric reduction projection optical system according to claim 11, wherein said anterior lens unit has negative refractive power.

* * * * *